US006709470B2

(12) United States Patent
Yoo

(10) Patent No.: US 6,709,470 B2
(45) Date of Patent: Mar. 23, 2004

(54) BENCHTOP PROCESSING

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 10/123,721

(22) Filed: Apr. 15, 2002

(65) Prior Publication Data

US 2003/0194883 A1 Oct. 16, 2003

(51) Int. Cl.⁷ .............................................. H01L 21/00
(52) U.S. Cl. ..................................... 29/25.01; 414/935
(58) Field of Search ...................... 438/308; 211/41.18; 414/935–941; 29/25.01

(56) References Cited

U.S. PATENT DOCUMENTS

| 4,976,613 | A | * | 12/1990 | Watanabe | 432/241 |
| 5,716,207 | A | * | 2/1998 | Mishina et al. | 432/253 |
| 5,837,555 | A | * | 11/1998 | Kaltenbrunner et al. | 437/248 |
| 6,139,641 | A | * | 10/2000 | Inokuchi et al. | 118/724 |
| 6,168,427 | B1 | * | 1/2001 | Cho et al. | 432/241 |
| 6,303,906 | B1 | * | 10/2001 | Yoo | 219/390 |

* cited by examiner

*Primary Examiner*—John Niebling
*Assistant Examiner*—Christopher Lattin
(74) *Attorney, Agent, or Firm*—MacPherson Kwok Chen & Heid LLP

(57) ABSTRACT

A benchtop processing system utilizing a wafer receptacle for wafer processing is provided. The wafer receptacle has a plurality of sloped projections capable of receiving a plurality of wafers having different diameter sizes. The wafer receptacle is transported to a processing chamber from a wafer reception module which can also be used as a cooling module. Advantageously, the benchtop processing system and method of the present invention allows for efficient and compact wafer processing.

20 Claims, 7 Drawing Sheets

BENCHTOP PROCESSING

BACKGROUND

1. Field of Invention

This invention generally relates to semiconductor manufacturing and, more particularly, to an apparatus and method for rapid thermal processing of a semiconductor wafer.

2. Related Art

New processing and manufacturing techniques are continuously being developed to make further advancements in the development of semiconductor devices, especially semiconductor devices of decreased dimensions. One such processing technique is know as Rapid Thermal Processing (RTP), which reduces the amount of time that a semiconductor device is exposed to high temperatures during processing. The RTP technique typically includes irradiating the semiconductor device or wafer with sufficient power to quickly raise the temperature of the wafer and hold it at that temperature for a time long enough to successfully perform a fabrication process, while avoiding such problems as unwanted dopant diffusion that would otherwise occur at the high processing temperatures.

What is needed is an easily accessible and efficient apparatus and method for wafer processing, including such techniques as RTP, that occupies minimal space.

SUMMARY

In accordance with an embodiment of the present invention, a processing system that is compact and capable of being placed in a small space, for example, atop a clean room laboratory bench, is provided. An operator can manually place wafers on a wafer receptacle within a wafer reception module. Once in position, the wafers are moved from within the wafer reception module to the processing module for processing.

In one embodiment, a benchtop processing system includes a wafer receptacle having a plurality of sloped projections capable of receiving a plurality of wafers, a wafer reception module housing the wafer receptacle in a first position, and a processing chamber operably coupled to the wafer reception module. The processing chamber defines an internal space which receives the wafer receptacle when the wafer receptacle is in a second position.

In another embodiment, a wafer receptacle includes a plurality of sloped projections capable of receiving a plurality of semiconductor wafers having different diameters, and a bottom slot for receiving a wafer to diffuse heat.

In yet another embodiment, a method of wafer processing discloses the use of a benchtop processing system in accordance with the present invention.

These and other features and advantages of the present invention will be more readily apparent from the detailed description of the preferred embodiments set forth below taken in conjunction with the accompanying drawings.

BRIEF DESCRIPTION OF THE DRAWINGS

The use of similar reference numerals in different figures indicates similar or identical items.

DETAILED DESCRIPTION

Figure 1:
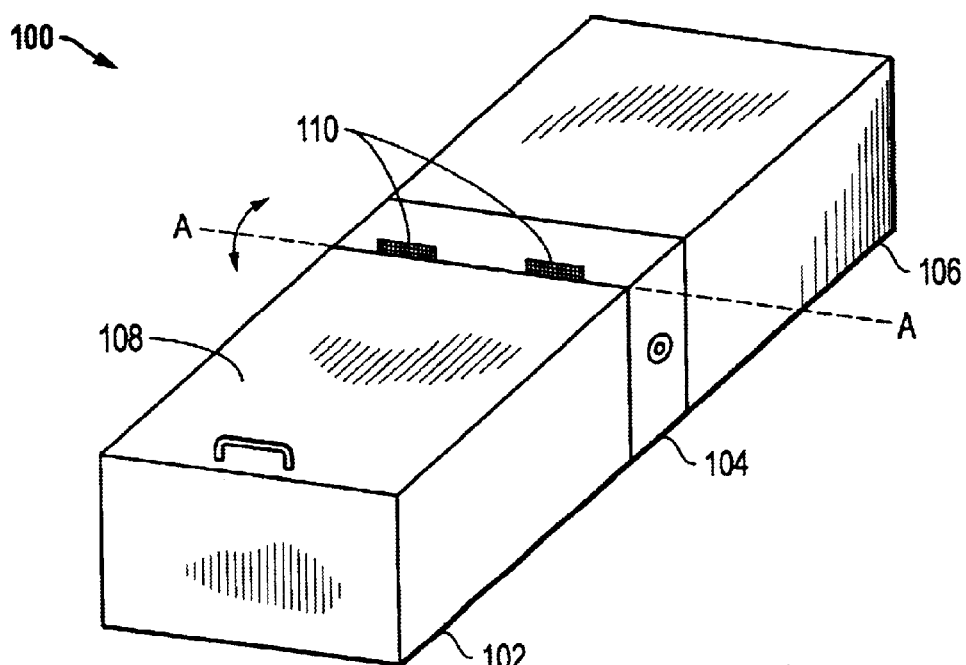
FIG. 1 is a perspective view of a benchtop processing system in accordance with one embodiment of the present invention.

FIG. 1 is a perspective view of a processing system 100 that establishes a representative environment of the present invention. Processing system 100 is referred to as a "benchtop" processing system due to its reduced size relative to other processing systems. As described in detail below, the benchtop processing system can be used to process from one to about five wafers per processing cycle. The benchtop processing system also provides the ability to manually manipulate wafers. The benchtop processing system does not require robotic manipulation of wafers, but can rather be loaded manually by the operator.

In one embodiment, benchtop processing system 100 includes a wafer reception module 102, gate valve assembly 104, and processing chamber 106. In accordance with the present invention, wafer reception module 102 has a door 108 rotatable about hinges 110. In one embodiment, an operator can open door 108 by hand to load a single wafer or optionally, multiple wafers, into processing system 100.

Figure 2A:
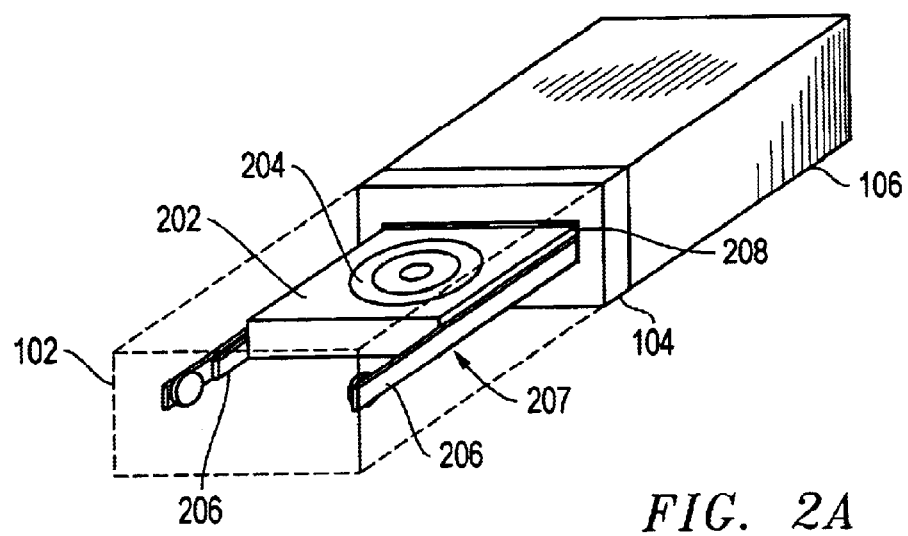
FIGS. 2A and 2B are a perspective view and a top view, respectively, of the interior of a wafer reception module of the benchtop processing system of FIG. 1 in accordance with one embodiment of the present invention.
Figure 2B:
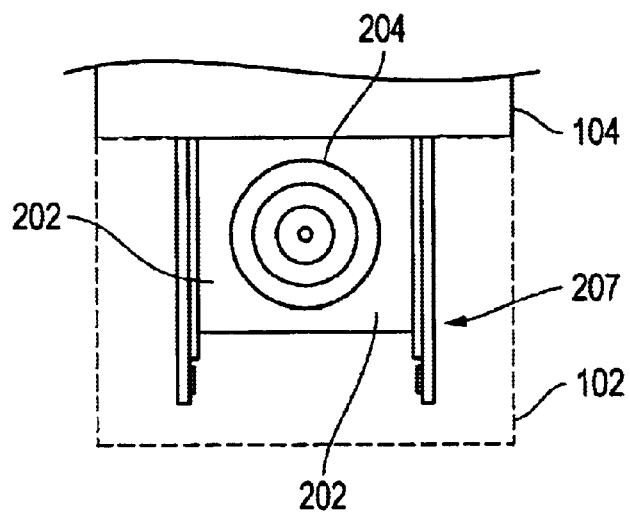

FIG. 2A shows a perspective view and FIG. 2B shows a top view of the interior of wafer reception module 102 with an outline of the walls of wafer reception module 102 shown by dashed lines. As illustrated in FIGS. 2A and 2B, wafer reception module 102 has disposed therein a transport assembly 207, in one embodiment including a wafer tray 202 that incorporates a wafer receptacle 204.

In one embodiment, wafer tray 202 is a rectangular shaped tray made from a material that can resist structural failure in the high temperature environment created in processing chamber 106. For example, wafer tray 202 can be made of quartz, silicon carbide, or the like. Wafer tray 202 is sized and shaped to be moved into processing chamber 106 through slot 208 in gate valve assembly 104.

Figure 3A:
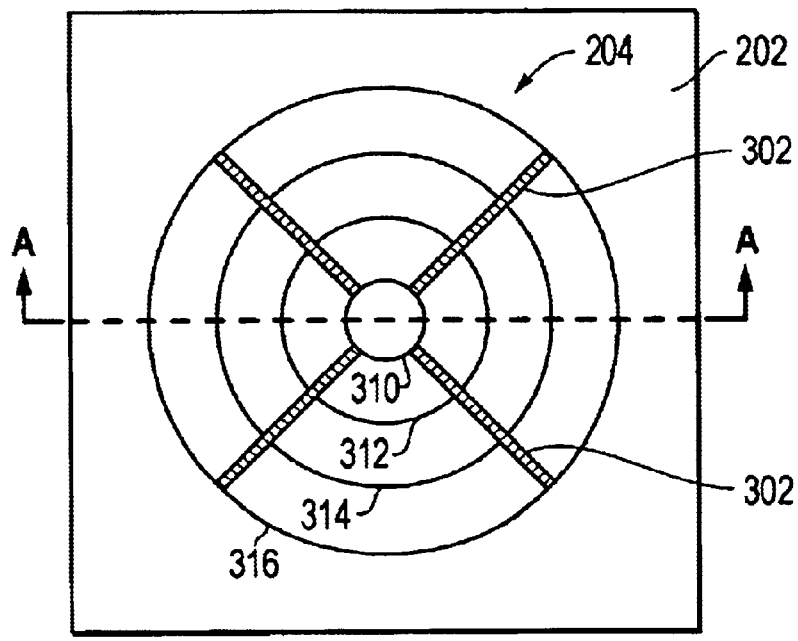
FIGS. 3A and 3B are a top view and side view, respectively, of a wafer receptacle in accordance with one embodiment of the present invention.
Figure 3B:
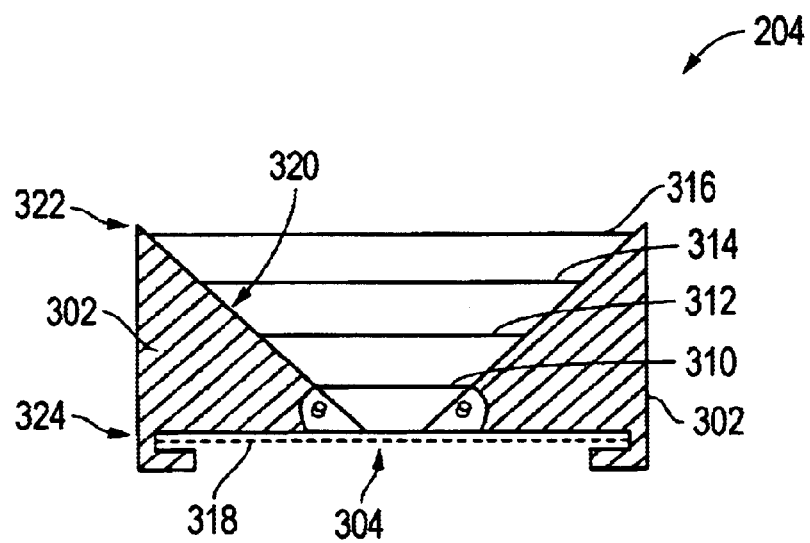

As shown in FIG. 2B, wafer tray 202 includes wafer receptacle 204 formed substantially in the center of wafer tray 202. FIGS. 3A and 3B illustrate one embodiment of wafer receptacle 204, which includes sloped projections 302 rising vertically perpendicular to wafer tray 202. FIG. 3A shows a top view of four sloped projections 302 equally spaced apart on wafer tray 202. Concentric circles 310–316 represent wafers placed on sloped projections 302. FIG. 3B shows a cross-section along line A—A of two sloped projections 302 in FIG. 3A. Lines 310–316 represent the same wafers as those placed on sloped projections 302 in FIG. 3A.

In one embodiment, as illustrated in FIGS. 3A and 3B, sloped projections 302 are thin triangular shaped structures having a sloped surface 320 with an apex 322 and a base 324. Similar to wafer tray 202, sloped projections 302 are made from a material that can resist structural failure in the high temperature environment created in processing chamber 106. For example, sloped projections 302 can be made of quartz or silicon carbide. Sloped projections 302 are made as thin as possible to have minimal contact between the sloped projections and the wafer placed on top of the sloped projections, thereby reducing any heat transfer from the wafer to the material of the sloped projections. Similarly, the exposed area of sloped projections 302 is minimized to reduce thermal mass and thereby reduce unwanted thermal absorption.

Figure 3C:
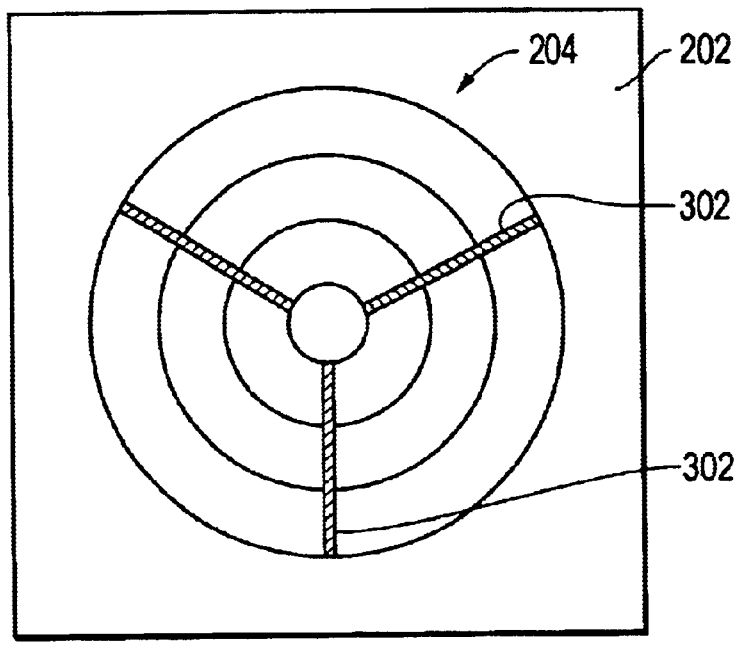
FIG. 3C is a top view of a wafer receptacle in accordance with another embodiment of the present invention.
Figure 3D:
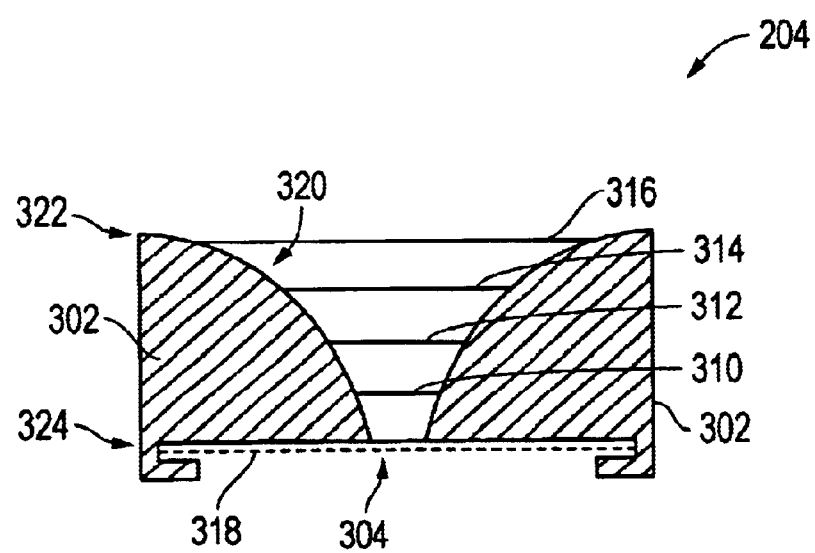
FIG. 3D is a side view of a wafer receptacle in accordance with another embodiment of the present invention.

FIG. 3C shows another embodiment of wafer receptacle 204 in which three sloped projections 302 are equally spaced apart on wafer tray 202. As explained above, having three sloped projections advantageously minimizes the thermal mass of the sloped projections and the available contact area between the sloped projections and the wafers, thereby allowing for efficient and evenly distributed heat processing of the wafers. In one embodiment, sloped projections 302 have a thickness between about 1.0 mm and about 3.0 mm. Further, as illustrated in FIG. 3B, sloped projections 302 may have a sloped surface 320 that is linear and makes an angle θ with base 324 between about 5 degrees and about 30 degrees. In other embodiments, sloped projections 302 may have a curved sloped surface 324, as illustrated in FIG. 3D.

Again referring to FIG. 3B, wafer receptacle 204 is able to receive multiple wafers having different diameters by utilizing sloped surface 320 of each sloped projection 302. In accordance with one embodiment of the present invention, wafers with smaller diameters are placed on receptacle 204 first and placed closer to base 324 of said sloped projections 302. Wafers with larger diameters are placed above wafers with smaller diameters and closer to apex 320 of said sloped projections 302. Accordingly, wafers are stacked one above the other on projections 302 along sloped surfaces 320 without touching one another. Thus, wafers 310–316 are stacked in increasing order of diameter size moving from base 324 toward apex 322. In one example, wafer 310 has a diameter of about 50 mm, wafer 312 has a diameter of about 75 mm, wafer 314 has a diameter of about 100 mm, and wafer 316 has a diameter of about 125 mm.

As further illustrated in FIG. 3B, wafer receptacle 204 also includes a slot 304 for holding a large diameter wafer to be utilized as a heat distribution structure. Heat diffusing members are incorporated in processing chambers to absorb thermal energy and to distribute the absorbed heat evenly throughout the interior space. Advantageously, in accordance with an embodiment of the present invention, heat diffusing members are not required because slot 304 allows a heat diffusing wafer 318 to act as the heat diffusing structure for the wafers above slot 304. Similarly, top wafer 316 may also act as a heat diffusing structure for the wafers held below it. Accordingly, wafers 316 and 318 sandwich wafers 310–314 for evenly distributed heat processing. In one example, wafers 316 and 318 both have diameters of about 125 mm but the wafers are not limited to having the same diameter.

Figure 2C:
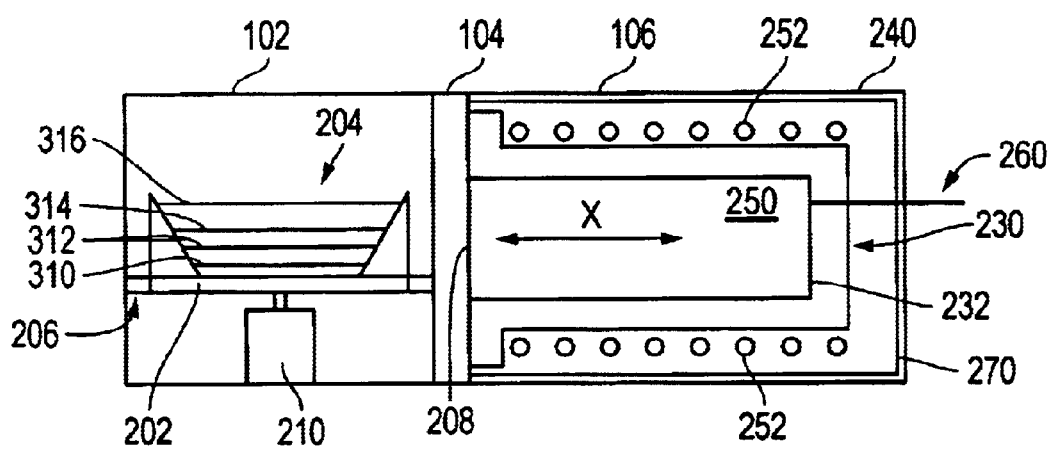
FIG. 2C is a side view of the bench top processing system of FIG. 1 in accordance with one embodiment of the present invention.

Referring back to FIGS. 2A and 2B, transport assembly 207 includes a wafer tray 202 held between two linear slide mechanisms 206 for slidably moving wafer tray 202 between a first position outside of processing chamber 106 and a second position inside of processing chamber 106. In one embodiment, slide mechanisms include telescoping rails and ball bearings. Transport assembly 207 provides a mechanism which permits wafer receptacle 204 to translate within processing chamber 106 along a horizontal axis indicated by double-arrowed line X (FIG. 2C). Transport assembly 207 can be any conventional mechanism that provides linear motion and that can be driven manually and/or automatically.

In another embodiment, as illustrated in FIG. 2C, transport assembly 207 incorporates a driving mechanism 210 for automatically operating transport assembly 207. Driving mechanism 210 can include any system designed to transfer rotational motion to linear motion, such as a gear, belt, or pulley drive. Screw or worm drives coupled to a motor and linear actuator or linear guide may also be included. Examples of typical linear actuators and linear guides for use with the present invention are available from THK Ltd. of Tokyo, Japan. Alternatively, driving mechanism 210 can include a hydraulic or pneumatic drive system, such as one including an air cylinder.

Figure 4A:
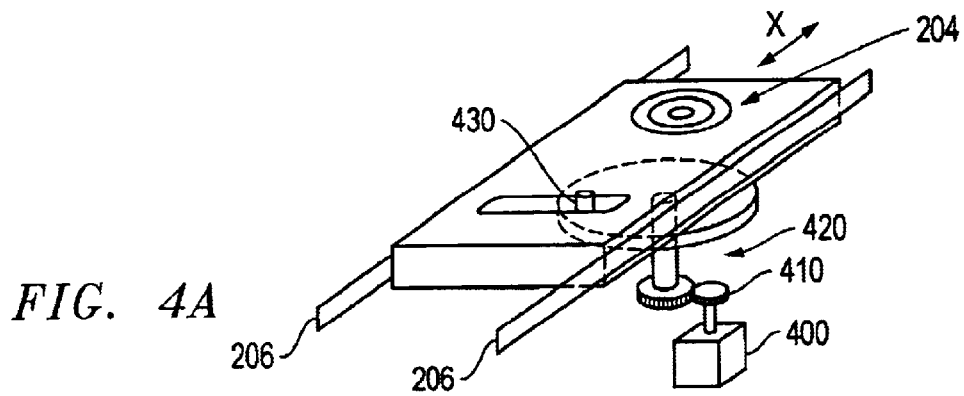
FIGS. 4A–4C are a perspective view, top view, and side view, respectively, of a transport assembly/wafer tray combination in accordance with one embodiment of the present invention.
Figure 4B:
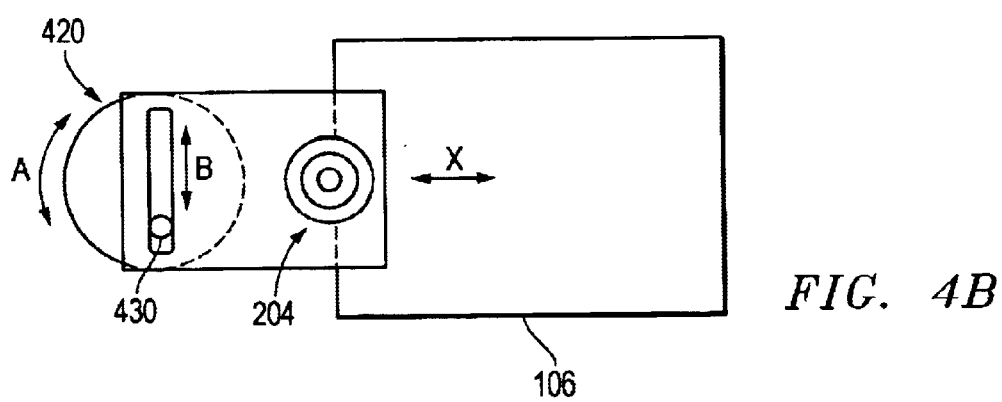
Figure 4C:
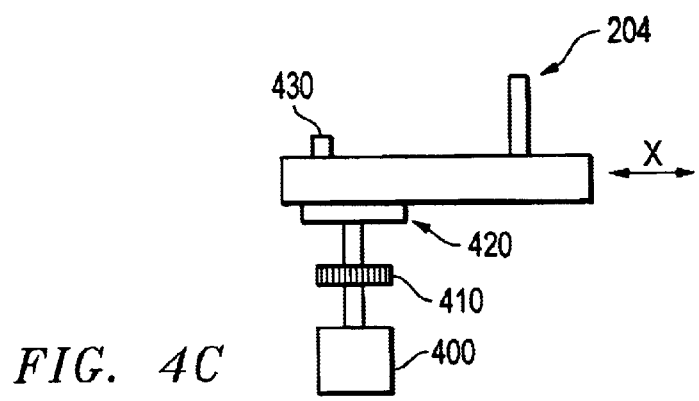

In an example of a driving mechanism shown in FIGS. 4A–4C, with no intention to limit the invention thereby, a motor 400 is connected to a gear 410 which rotates gear shaft assembly 420 in a direction A. Gear shaft assembly 420 moves knob 430 along a direction B which moves wafer tray 202 along axis X between a first position and a second position outside and inside processing chamber 106, respectively.

Figure 5A:
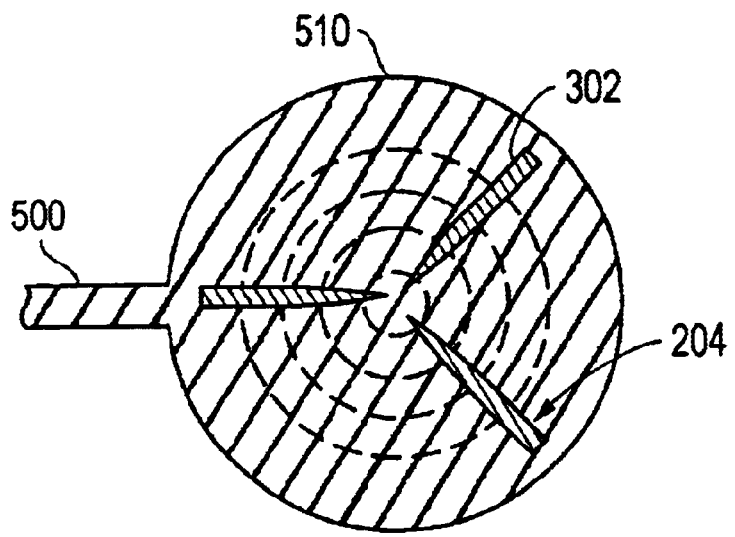
FIG. 5A is a top view of a robot arm/end effector/wafer receptacle combination in accordance with one embodiment of the present invention.
Figure 5B:
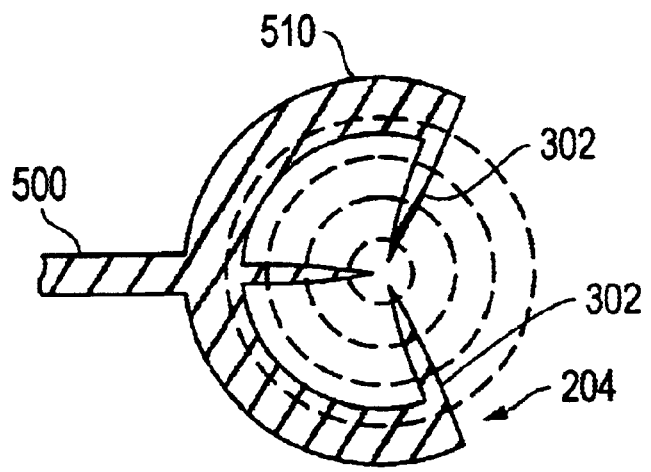
FIG. 5B is a top view of a robot arm/end effector/wafer receptacle combination in accordance with another embodiment of the present invention.

Alternatively, as shown in FIG. 5A, transport assembly 207 may be replaced with a robot arm 500 including an end effector 510 with wafer receptacle 204. FIG. 5B illustrates another embodiment of an end effector 510 formed with wafer receptacle 204 to have minimal thermal mass. In both FIGS. 5A and 5B, dashed lines represent wafers of different diameters placed on sloped projections 302 of wafer receptacle 204.

In one embodiment of the present invention, a gate valve 104 is operably coupled between wafer reception module 102 and processing chamber 106 to provide a closeable/sealable access to processing chamber 106 for wafer receptacle 204. An example of a gate valve that may be used in accordance with the present invention is described in commonly assigned U.S. patent application Ser. No. 10/23,832, filed on Apr. 15, 2000, and is incorporated by reference herein. However, typical gate valves known to those of ordinary skill in the art may be also used in accordance with the present invention to provide access to processing chamber 106.

Figure 6A:
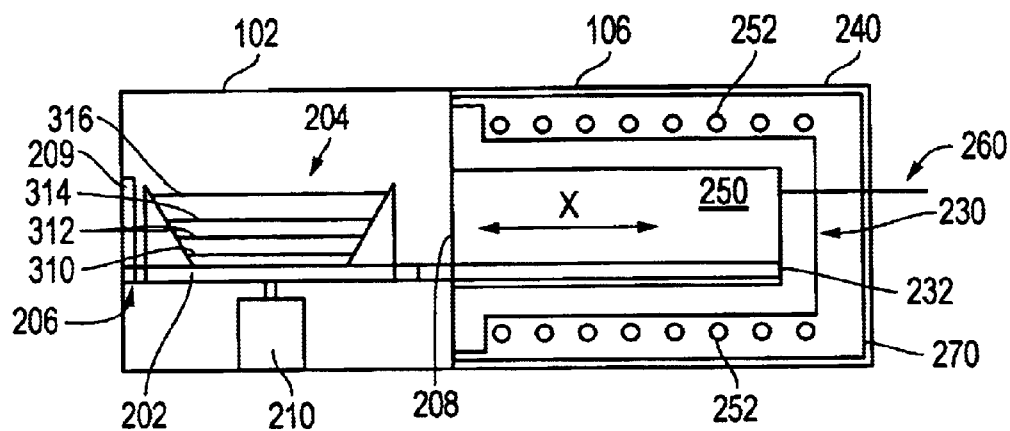
FIGS. 6A and 6B are side views of the benchtop processing system including a reflector in accordance with one embodiment of the present invention.
Figure 6B:
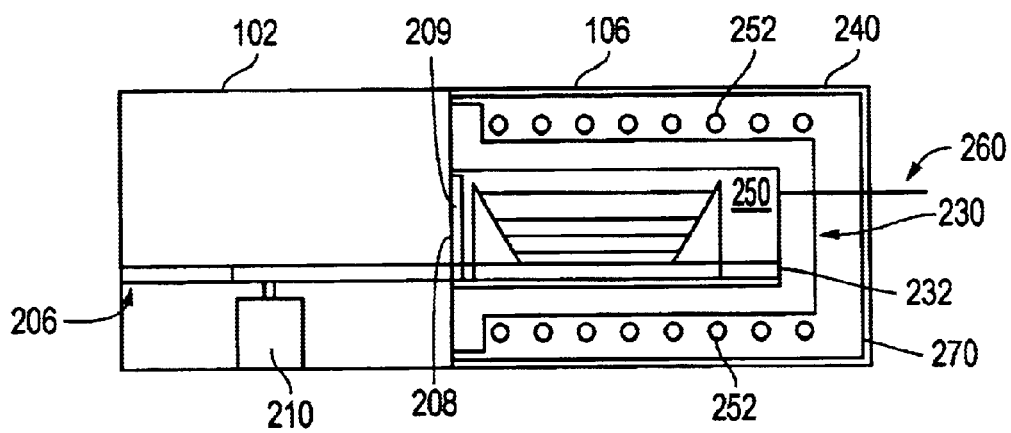

In another embodiment, gate valve 104 can be removed from the system. Alternatively, a gate 209, as illustrated in FIGS. 6A and 6B, may be used to thermally isolate processing chamber 106. In this embodiment, gate 209 is coupled to transport assembly 207, specifically to an end of wafer tray 202. Gate 209 can be shaped to fit into or even seal aperture or slot 208. In operation, when wafer receptacle 204 is moved into processing chamber 106, as illustrated in FIG. 6B, gate 209 provides a closure.

Gate 209 may be otherwise appropriately connected to transport assembly 207 in order to fit into or seal slot 208 for thermally isolating processing chamber 106. Optionally, gate 209 may be made of a highly polished metal or may be coated with a heat/radiation reflective coating, such as gold, silver, nickel, molybdenum, or other metal with a high melting point relative to the process temperatures. The reflective surface may reflect radiation energy back into processing chamber 106. In one embodiment, the reflective coating may be a thin-film coating (e.g., less than one micron in thickness).

In one embodiment, processing chamber 106 can be an RTP reactor, such as those used in thermal anneals. One example of an RTP reactor is described in U.S. Pat. No. 6,303,906, issued on Oct. 16, 2001, and is incorporated by reference herein. In other embodiments, processing chamber 106 can be other types of reactors, such as those used for dopant diffusion, thermal oxidation, nitridation, chemical vapor deposition, and similar processes, as is well known by those of ordinary skill in the art.

Referring back to FIG. 2C, a simplified cross-sectional view of processing chamber 106 is shown in accordance with one embodiment of the present invention. Externally, processing chamber 106 may be a metallic shell preferably made of aluminum or similar metal, defining an opening 250 configured to receive wafer receptacle 204 for processing.

Processing chamber 106 can include a process tube 232, which defines an interior cavity 250 in which processing of wafers in wafer receptacle 204 can occur. In one embodiment, process tube 232 may be constructed with a substantially rectangular cross-section, having a minimal internal volume surrounding wafer receptacle 204. In one embodiment, the volume of process tube 232 is usually no greater than about 10,000 cm$^3$, and preferably the volume is less than about 1,000 cm$^3$. In one example, process tube 232 may have a width of approximately 150 mm and a length of approximately 230 mm. Process tube 232 can be made of quartz, but may be made of silicon carbide, Al$_2$O$_3$, or other suitable material.

For processing that requires control over pressure, process tube 232 can be capable of being pressurized utilizing pumps, such as a vacuum pump or venturi pump.

Process tube 232 can also include a gas tube 260 to allow process or purge gases, such as N$_2$, O$_2$, and Ar, into processing chamber 106. In one embodiment, gas tube 260 is formed into the walls of process tube 232, or alternatively, gas tube 260 can be formed along the walls of process tube 232. Controllers such as mass flow controllers, flowmeters, and needle valves may be used to control the flow of gases into process tube 232.

Opening or slot 208 provides access for the wafer receptacle into and out of processing chamber 106. Slot 208 may be a relatively small opening, but with a height and width large enough to accommodate wafer receptacle 204 and transport assembly 207 or a portion of a robot arm 500 (FIGS. 5A and 5B) passing therethrough. The height of slot 208 can be between about 10 mm and about 50 mm, and preferably, no greater than about 20 mm.

Referring again to FIG. 2C, processing chamber 106 includes an open internal space sized and shaped so as to integrate process tube 232 and heating elements 252. In one example, processing chamber 106 has a length of approximately 230 mm, a width of approximately 180 mm, and a distance between a lower and upper set of heating elements 252 of approximately 20 mm.

In some embodiments, processing chamber 106 can include a plurality of thermal insulation layers 270, which help to maintain temperature levels within processing chamber 106 during and after processing. In one example, a single thermal insulation layer 270 is positioned between heating elements 252 and the outer wall of processing chamber 106. Thermal insulation layer 270 may be made of any suitable insulation, such as a ceramic fiber material. In one example, thermal insulation layer 270 is approximately 25 mm thick.

In operation, gate valve 104 is placed in an open position to provide access to processing chamber 106. Wafer receptacle 204 is then moved into processing chamber 106 by various mechanisms described above, such as by a tray and transport assembly or a robot arm including an end effector with wafer receptacle 204. These mechanisms may be automated or alternatively, manually driven. When wafer receptacle 204 is received into space 250 within process tube 232, processing begins. In one example, heating elements 252 may perform a heat treatment step. Alternatively, gate valve 104 may not be used. Instead, gate 209 attached at an end of wafer tray 202 is properly positioned over slot 208 to physically and thermally isolate processing chamber 106 when wafer receptacle 204 is moved into position within processing chamber 106 (FIGS. 6A and 6B).

Once processing is complete or when cooling is desired, the movement of wafer receptacle 204 can be reversed. Wafer receptacle 204 is moved into a first position outside of processing chamber 106 and inside wafer reception module 102. Wafer receptacle 204 becomes exposed to the inner walls and inner environment of wafer reception module 102 where wafers placed on wafer receptacle 204 may be cooled. Thus, wafer reception module 102 may serve as a cooling station.

In some embodiments, various well known devices and methods for facilitating the transfer of heat can be applied to reception module 102 to increase the temperature difference between the walls of reception module 102 and wafer receptacle 202, thus accelerating the heat transfer process. For example, a cooling jacket can be placed around reception module 102 to lower the temperature of the inner walls, thus allowing the inner walls to more quickly absorb heat.

In the present invention, effort has been made to include a processing system which includes a wafer reception module and a processing chamber of minimal proportions. Keeping the volume of the processing chamber small minimizes the amount of impurities introduced into the chamber during processing. For example, a smaller volume processing chamber may reduce the amount of impure O$_2$ or other unwanted gases from being introduced into the processing environment. Another result of the small volume is that uniformity in temperature is more easily maintained. Further, less purge gases are required to vent the benchtop processing system between processing steps and therefore less process or purge gases are ultimately wasted.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

What is claimed is:

1. A benchtop processing system, comprising:
    a wafer reception module;
    a wafer receptacle having a plurality of sloped projections capable of receiving one to a plurality of wafers; and
    a processing chamber operably coupled to said wafer reception module, said wafer receptacle being movable from a first position within said wafer reception module to a second position within said processing chamber.

2. The processing system of claim 1, further comprising a transport assembly capable of moving said wafer receptacle between said first position and said second position.

3. The processing system of claim 2, wherein said transport assembly comprises a linear slide mechanism.

4. The processing system of claim 2, wherein said transport assembly comprises a gate structure that is capable of thermally isolating said processing chamber when processing wafers.

5. The processing system of claim 2, wherein said transport assembly comprises a robot arm having an end effector including said wafer receptacle.

6. The processing system of claim 1, wherein said wafer receptacle includes a bottom slot for receiving a wafer to diffuse heat during processing.

7. The processing system of claim 1, wherein said wafer receptacle has at least three sloped projections.

8. The processing system of claim 1, wherein said wafer receptacle is capable of receiving wafers having a diameter between about 50 mm and about 125 mm.

9. The processing system of claim 1, wherein said plurality of sloped projections have a linear sloped surface having a slope from a bottom of said wafer receptacle to a top of said wafer receptacle between about 5 degrees and about 30 degrees.

10. The processing system of claim 1, wherein said plurality of sloped projections have a curved sloped surface.

11. The processing system of claim 1, further comprising a gate valve operably coupled to said processing chamber, said gate valve capable of opening and closing to allow said wafer receptacle to move between said first position and said second position.

12. A wafer receptacle, comprising:
a plurality of sloped projections capable of receiving a plurality of semiconductor wafers having different diameters.

13. The wafer receptacle of claim 12, wherein said plurality of sloped projections comprise at least three sloped projections.

14. The wafer receptacle of claim 12, wherein said plurality of sloped projections is capable of receiving wafers having a diameter between about 50 mm and about 125 mm.

15. The wafer receptacle of claim 12, wherein said plurality of sloped projections have a linear sloped surface having a slope from a bottom of said wafer receptacle to a top of said wafer receptacle between about 5 degrees and about 30 degrees.

16. The wafer receptacle of claim 12, wherein said plurality of sloped projections have a curved sloped surface.

17. The wafer receptacle of claim 12, wherein said plurality of sloped projections comprise quartz.

18. A method of processing wafers, comprising:
providing a benchtop processing system including:
a wafer receptacle having a plurality of sloped projections capable of receiving a plurality of wafers;
a wafer reception module housing said wafer receptacle in a first position; and
a processing chamber operably coupled to said wafer reception module, said processing chamber defining an internal space for receiving said wafer receptacle when said wafer receptacle is in a second position;
placing a plurality of wafers on said wafer receptacle;
moving said wafer receptacle from said first position to said second position inside said processing chamber;
processing said wafers; and
moving said wafer receptacle from said second position to said first position.

19. The method of claim 18, wherein said plurality of wafers are placed on said wafer receptacle in order of diameter size beginning with the wafer having the smallest diameter.

20. The method of claim 18, further comprising cooling said wafers on said wafer receptacle in a wafer reception module after processing.

* * * * *